United States Patent [19]

Laudt

[11] Patent Number: 4,550,852
[45] Date of Patent: Nov. 5, 1985

[54] SWITCH BOX AND CLOSURE THEREFOR

[75] Inventor: Jürgen Laudt, Herborn, Fed. Rep. of Germany

[73] Assignee: Rittal-Werk Rudolf Loh GmbH & Co. KG, Fed. Rep. of Germany

[21] Appl. No.: 669,646

[22] Filed: Nov. 8, 1984

[30] Foreign Application Priority Data

Nov. 9, 1983 [DE] Fed. Rep. of Germany ... 8332164[U]

[51] Int. Cl.⁴ ............................................. B65D 45/00
[52] U.S. Cl. .................................... 220/327; 620/3.8; 174/66
[58] Field of Search ............ 220/3.8, 3.94, 3.2, 220/325, 327, 328; 174/66, 67, 53

[56] References Cited

U.S. PATENT DOCUMENTS 2,804,116 8/1957 Van Nieh et al. ................. 220/327
3,937,352 2/1976 Kalious ............................... 220/327

*Primary Examiner*—George T. Hall
*Attorney, Agent, or Firm*—Thomas W. Speckman

[57] ABSTRACT

A switch box having a box-like lower compartment with a locking upper edge and mounting flanges positioned in the interior upper corners, and a cover with downwardly turned edges provided in the area of each of its corners with mounting sockets, the locking fastener comprising a connector which is retained in the mounting sockets on the cover of the switch box, the connector having a locking component which may be inserted in a single, predetermined position in a locking element fixed to the mounting flanges to retain the connector in an axially non-displaceable manner, thereby fastening the cover to the lower compartment of the switch box.

18 Claims, 3 Drawing Figures

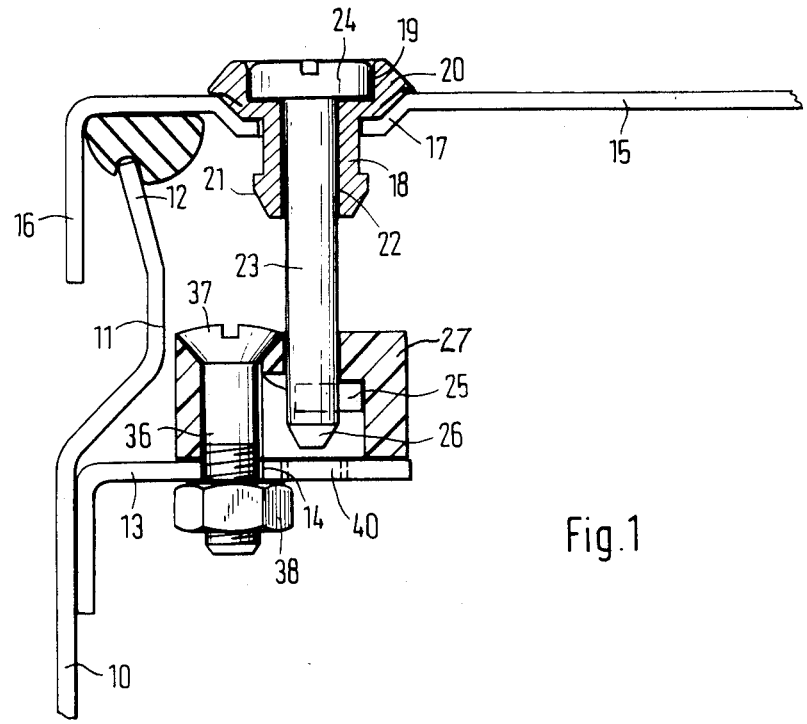
Fig.1
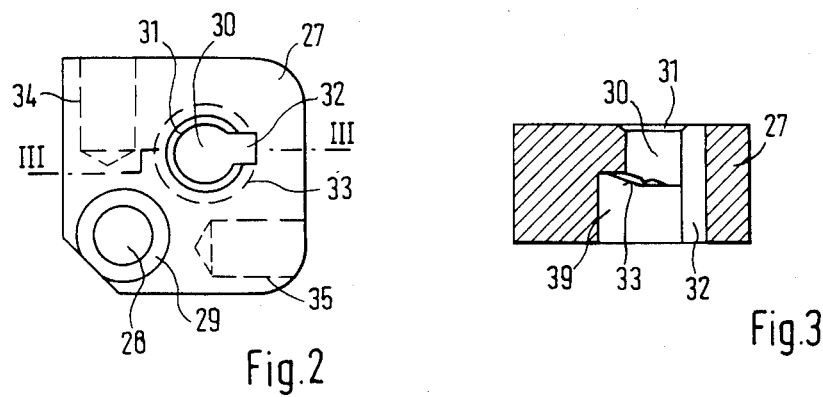
Fig.2
Fig.3

SWITCH BOX AND CLOSURE THEREFOR

BACKGROUND OF THE INVENTION

This invention relates to a switch box with a box-like lower compartment which has a locking upper edge, and a cover with downwardly turned edges which fastens in the opening of the lower compartment and is provided in the area of each of its corners with mounting sockets for connecting screws which can be screwed into threaded mounts on connecting flanges positioned in the interior upper corners of the lower compartment.

Removal of the cover from the lower compartment of prior switch boxes requires time consuming dismounting work since all the connecting screws must be removed from the threaded bores of the connecting flanges. It is time consuming even if the cover is articulated by means of a hinge joint on one side to open to the lower compartment and only two connecting screws have to be loosened.

SUMMARY OF THE INVENTION

It is an objective of this invention, in a switch box of the type described above, to significantly simplify removal and installation of the cover, so that the few necessary mechanical steps may be carried out both simply and rapidly.

This objective is attained in accordance with the present invention as follows: a locking element with a mount to receive a connector having a locking component is fastened on the connecting flanges, the locking component only insertable in the mount of the locking element in a single, predetermined angular position so the connector can be removed by means of rotation, or can be retained in an axially non-displaceable manner in the mount.

The connector of this type, in combination with the locking element on the connecting flange, comprises a rapid fastener whereby locking and unlocking can be accomplished with little rotational movement. The locking element and the connector having a locking component comprising the rapid fastener may be installed on switch boxes which are presently being used, in a simple and convenient manner.

It has proven to be advantageous that the connector is securely retained in such a way that it cannot be displaced from its mounting socket, which is retained in the cover in such a way that it also cannot be displaced. The connectors are also retained in the cover when they are loose so they cannot be misplaced.

The attachment of the locking elements to the connecting flanges is accomplished according to one embodiment, in that each connecting flange has a bore for a fastening screw in addition to the existing threaded mount to receive a connecting screw, and a fastening screw is inserted into the fastening bore in the locking element.

Additional attachment alternatives for the locking element are provided in accordance with another embodiment in that the locking element is shaped as a square and the lateral walls directed parallel to the mount and the fastening bore are provided with additional fastening mounts, such as blind-end threaded mounts.

If the cover is to be rapidly and completely removable from the lower compartment, then one embodiment provides that the connecting flanges in all four corners have locking elements attached to receive the connectors with locking components.

In an articulated cover, one embodiment provides that both connecting flanges on one side of the switch box have locking elements attached to accommodate connectors with locking components, and that the opposite side of the cover is connected in an articulated manner with the lower compartment by means of a hinge joint.

The connector having a locking component and the locking element having a complementary mount to accommodate the locking component are, according to one embodiment, designed so that the connector is provided on its terminal, penetrating end with a projecting locking lug, the mount in the locking element has a groove to receive the locking lug, and the mount makes a transition into an expanded holding mount to retain the locking lug in accordance with the penetrating depth of the connector. When the locking lug of the connector is inserted into the expanded holding mount, it is retained so it is axially non-displaceable, and the cover is securely retained on the lower compartment. The cover can be easily braced against the lower section, if it is provided, in accordance with another embodiment, that the transition from the mount to the holding mount forms a tightening rotational path for the locking lug of the connector.

Penetration of the connector into the mount of the locking element may be facilitated by the fact that the connector, on its free end, may form a tapered point.

Retaining the connector in its mounting socket on the cover in such a way that it cannot be displaced is achieved, in accordance with one embodiment, when the locking lug is inserted as a separate part into a mount on the connector. This locking lug is first inserted after positioning the connector in its mounting socket on the cover.

Another embodiment of the connector and its locking component is distinguished by the fact that the connector has an aperture to receive a locking pin disposed on the locking element, and that the aperture in the connector rotates in the longitudinal direction of the connector as a locking curve for the locking pin. The locking pin disposed on the locking element is engaged in the aperture of the connector and when the connector turns after engaging the locking pin, the locking pin is securely retained in the aperture.

BRIEF DESCRIPTION OF THE DRAWINGS

This invention is best understood with reference to the following drawings in which:

FIG. 1 shows, in cross section, connection of the cover and the lower compartment of a switch box with the locking element and connector of one embodiment of this invention;

FIG. 2 shows the locking element shown in FIG. 1 in a top view; and

FIG. 3 shows a section through the locking element shown in FIG. 2 along line III—III.

DESCRIPTION OF THE PREFERRED EMBODIMENTS

FIG. 1 shows a switch box of the present invention having a lower compartment defined by wall (10) with bending locking edge (11) and cover (15) having turned down edge (16) extending therefrom. The desired attachment occurs in the area of the corner, where cover

(15) forms depression (17) having a penetrating hole. Mounting socket (18) is engaged in this penetrating hole and retained therein by locking elements (21). Mounting socket (18) has enlarged bore (19) to receive the head (24) of connector (23) which is securely retained within the aperture. Flange (20) encircles enlarged bore (19) and prevents the screwdriver from slipping while adjusting connector (23). The bore (22) of mounting socket (18) accommodates the shaft of connector (23). Connector (23) is inserted into engaged mounting socket (18). Locking lug (25) may then be inserted at the free end of inserted connector (23), lug (25) acting as a type of key bit and projecting out from the shaft of connector (23). The terminal end of connector (23) may be formed as a tapered point (26).

Angular connecting flange (13) is fastened on the internal side of wall (10) forming the lower compartment; threaded bore (40) in the connecting flange is directed parallel to the central axis of mounting socket (18) and is aligned therewith. In addition to threaded bore (40), bore (14) to receive fastening screw (36) is formed in connecting flange (13), for the attachment of square-shaped locking element (27) to angular connecting flange (13). The protruding head (37) of fastening screw (36) is sunk in countersink (29) of fastening bore (28) of locking element (27). With tightening of nut (38) on fastening screw (36), the attachment of locking element (27) to connecting flange (13) is completed. Lateral fastening mounts (34, 35), which may, for example, be threaded mounts, may facilitate the attachment of locking element (27) in another way.

Locking element (27) has bore (30) directed parallel to the central axis of the connector and having groove (32) to accommodate connector (23). Groove (32) penetrates locking element (27) to ensure that connector (23) can only be inserted into bore (30) in the single, predetermined position in which locking lug (25) passes through groove (32). Conical entry (31) on the outer, initial penetration side facilitates the insertion of connector (23) into the mount. When cover (15) is fastened or set on wall (10) forming the lower compartment, then locking edge (11) with sealing end portion (12) rests on the sealing element of cover (15). Connector (23) is rotated so that locking lug (25) engages in tightening rotational path (33) and is turned into expanded holding mount (39). In this way, by means of connector (23), a tightening force is produced between cover (15) and lower compartment walls (10), and locking lug (25) on connector (23) is held tight and axially non-displaceable through bore (30) along the transition to expanded holding mount (39).

Locking element (27) and connector (23) may be provided at each corner of a switch box, since connecting flanges (13) are already provided on known switch boxes. The connecting screws used with known switch boxes are replaced by connector (23). If all four corners of cover (15) are provided with the rapid fastener of this invention, then cover (15) can be removed quickly and easily from the lower compartment. If cover (15) is articulated on one side to the lower compartment, then, using two rapid fasteners, cover (15) can be quickly and easily opened and closed again.

The locking connection between locking element (27) and connector (23) may also be achieved in other ways. Locking element (27) may have a locking pin disposed in bore (30). The terminal end of connector (23) may be provided with an aperture to receive the locking pin. The aperture revolves in the longitudinal direction of the connector so that, as the stationary locking pin engages in the aperture of connector (23), the connector (23) may still be rotated. The locking pin is engaged in the aperture of connector (23) so that axially non-displaceable fastening is attained.

I claim:

1. A switch box comprising a box-like lower compartment formed by walls (10) having a locking upper edge (12) and a cover (15) with downwardly turned edges (16) which fastens over the opening of said lower compartment, and is provided in the area of at least two of its corners with mounting flanges (13) for connecting screws (36) which can be screwed into threaded bores (14) on said mounting flanges positioned in the interior upper corners of said lower compartment, characterized by a locking element (27) with bore (30) for connector (23) having a locking means and fastened to said cover (15), fastened on said flanges (13), said locking means only insertable in and removable from said bore (30) in said locking element (27) in a single, predetermined angular position to retain said connector in an axially non-displaceable manner in said bore (30).

2. A switch box in accordance with claim 1, characterized by said connector (23) being retained non-displaceably in a mounting socket (18), which is retained non-displaceably in said cover (15).

3. A switch box in accordance with claim 2, characterized by said connecting flange (13) having a bore (14) to receive fastening screw (36) which is inserted into fastening bore (28) of said locking element (27), said fastening screw (36) with nut (38) retaining locking element (27) in position on connecting flange (13).

4. A switch box in accordance with claim 3, characterized by said locking element (27) being square-shaped and provided with additional fastening bores (34, 35) in its side walls having their axes directed at right angles to said bore (30) and said fastening bore (28).

5. A switch box in accordance with claim 4, characterized by having mounting flanges (13) in all four corners of said switch box supporting said locking elements (27).

6. A switch box in accordance with claim 4, characterized by having locking elements (27) attached to said mounting flanges (13) on one side of said switch box and, on the opposite side of said switch box, said cover (15) is connected in an articulated manner by means of a hinge joint to said wall (10).

7. A switch box in accordance with claim 6, characterized by said connector (23) provided on its penetrating end with a projecting locking lug (25), said bore (30) in said locking element (27) having a groove (32) to receive said locking lug (25), and said bore (30) making a transition into expanded holding mount (39) to retain said locking lug (25) in accordance with the penetrating depth of said connector (23).

8. A switch box in accordance with claim 7, characterized by said transition from said bore (30) into said expanded holding mount (39) comprising a tightening rotational path (33) engaging said locking lug (25) of said connector (23).

9. A switch box in accordance with claim 8, characterized by said connector (23), on its terminal end having tapering point (26) and said bore (30) having conically expanding entry (31) on the upper, penetration side of said locking element.

10. A switch box in accordance with claim 9, characterized by said locking lug (25) being retained as a separate part in a bore in said connector (23).

11. A switch box in accordance with claim 6, characterized by said connector (23) having an aperture to receive a locking pin disposed in bore (30) of said locking element (27); said aperture in said connector (23) revolving in the longitudinal direction of said connector (23) and engaging said locking pin.

12. A switch box in accordance with claim 2, characterized by said connecting flange (13) having a bore (14) to receive fastening screw (36) which is inserted into fastening bore (28) of said locking element (27), said fastening screw (36) with nut (38) retaining locking element (27) in position on connecting flange (13).

13. A switch box in accordance with claim 3, characterized by said locking element (27) being square-shaped and provided with additional fastening bores (34, 35) in its side walls having their axes directed at right angles to said bore (30) and said fastening bore (28).

14. A switch box in accordance with claim 4, characterzed by having mounting flanges (13) in all four corners of said switch box supporting said locking elements (27).

15. A switch box in accordance with claim 4, characterized by having locking elements (27) attached to said mounting flanges (13) on one side of said switch box and, on the opposite side of said switch box, said cover (15) is connected in an articulated manner by means of a hinge joint to said wall (10).

16. A switch box in accordance with claim 6, characterized by said connector (23) provided on its penetrating end with a projecting locking lug (25), said bore (30) in said locking element (27) having a groove (32) to receive said locking lug (25), and said bore (30) making a transition into expanded holding mount (39) to retain said locking lug (25) in accordance with the penetrating depth of said connector (23).

17. A switch box in accordance with claim 7, characterized by said locking lug (25) being retained as a separate part in a bore in said connector (23).

18. A switch box in accordance with claim 6, characterized by said connector (23) having an aperture to receive a locking pin disposed in bore (30) of said locking element (27); said aperture in said connector (23) revolving in the longitudinal direction of said connector (23) and engaging said locking pin.

* * * * *